(12) United States Patent
Chow et al.

(10) Patent No.: US 9,524,470 B1
(45) Date of Patent: Dec. 20, 2016

(54) MODULAR ARRAY OF VERTICALLY INTEGRATED SUPERCONDUCTING QUBIT DEVICES FOR SCALABLE QUANTUM COMPUTING

(71) Applicant: International Business Machines Corporation, Armonk, NY (US)

(72) Inventors: Jerry M. Chow, White Plains, NY (US); Jay M. Gambetta, Yorktown Heights, NY (US); Mary B. Rothwell, Ridgefield, CT (US); James R. Rozen, Peekskill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/737,707

(22) Filed: Jun. 12, 2015

(51) Int. Cl.
| | | |
|---|---|---|
| *H01L 29/02* | (2006.01) | |
| *G06N 99/00* | (2010.01) | |
| *H01L 39/22* | (2006.01) | |
| *H01L 39/04* | (2006.01) | |
| *H01L 25/04* | (2014.01) | |
| *H01L 39/24* | (2006.01) | |

(52) U.S. Cl.
CPC ............ *G06N 99/002* (2013.01); *H01L 25/04* (2013.01); *H01L 39/045* (2013.01); *H01L 39/223* (2013.01); *H01L 39/2493* (2013.01)

(58) Field of Classification Search
CPC ...... H01L 25/04; H01L 39/025; H01L 39/045; H01L 39/223; H01L 39/2493; H01L 29/158; H01L 49/006; G06N 99/002

USPC .......................................... 438/2; 257/31, 36
See application file for complete search history.

(56) References Cited

U.S. PATENT DOCUMENTS

| | | | |
|---|---|---|---|
| 7,932,514 B2 | 4/2011 | Farinelli et al. | |
| 8,455,278 B2* | 6/2013 | Linares ................. | B82Y 10/00 216/2 |
| 8,642,998 B2 | 2/2014 | Gambetta et al. | |
| 8,659,007 B2 | 2/2014 | Bonderson et al. | |
| 8,872,360 B2 | 10/2014 | Chow et al. | |
| 9,219,298 B2* | 12/2015 | Abraham ................ | H01P 7/086 |
| 2004/0016918 A1* | 1/2004 | Amin ..................... | B82Y 10/00 257/14 |
| 2014/0097405 A1 | 4/2014 | Bunyk | |
| 2014/0235450 A1 | 8/2014 | Chow et al. | |

OTHER PUBLICATIONS

Chow, Jerry M., et al.; "Modular Array of Vertically Integrated Superconducting Qubit Devices for Scalable Quantum Computing"; U.S. Appl. No. 15/175,454, filed Jun. 7, 2016.

(Continued)

*Primary Examiner* — Hung Vu
(74) *Attorney, Agent, or Firm* — Cantor Colburn LLP; Vazken Alexanian

(57) ABSTRACT

A technique relates to an assembly for a quantum computing device. A quantum bus plane includes a first set of recesses. A readout plane includes a second set of recesses. A block is positioned to hold the readout plane opposite the quantum bus plane, such that the first set of recesses opposes the second set of recesses. A plurality of qubit chips are included where each has a first end positioned in the first set of recesses and has a second end positioned in the second set of recesses.

10 Claims, 12 Drawing Sheets

(56) References Cited

OTHER PUBLICATIONS

List of IBM Patents or Patent Applications Treated as Related—Date Filed: Jun. 7, 2016; 1 page.

C. Rigetti et al., "Fully Microwave-Tunable Universal Gates in Superconducting Qubits with Linear Couplings and Fixed Transition Frequencies," Physical Review B., vol. 81, 2010, 134507, 7 pages.

H. Paik et al., "Observation of high coherence in Josephson junction qubits measured in a three-dimensional circuit QED architecture," Physical Review Letters, vol. 107, No. 24, 2011, 240501, 5 pages.

J. Chow et al., "Implementing a strand of a scalable fault-tolerant quantum computing fabric." Nature Communications, vol. 5, 2014, 4015, 9 pages.

M. Goryachev et al., "The 3D split-ring cavity lattice: a new metastructure for engineering arrays of coupled microwave harmonic oscillators," New Journal of Physics, vol. 17, No. 2, 2015, 023003, 11 pages.

\* cited by examiner

MODULAR ARRAY OF VERTICALLY INTEGRATED SUPERCONDUCTING QUBIT DEVICES FOR SCALABLE QUANTUM COMPUTING

BACKGROUND

The present invention relates to quantum computing, and more specifically, to a modular array of vertically integrated superconducting qubit devices for scalable quantum computing.

In one approach called circuit quantum electrodynamics, quantum computing employs active superconducting devices called qubits to manipulate and store quantum information, and resonators (e.g., as a two-dimensional (2D) planar waveguide or as a three-dimensional (3D) microwave cavity) to read out and facilitate interaction among qubits. Each superconducting qubit comprises one or more Josephson junctions shunted by capacitors in parallel with the junctions. The qubits are capacitively coupled to 2D or 3D microwave cavities. The energy associated with the qubit resides in the electromagnetic fields around the Josephson junction and especially in the vicinity of relatively larger shunt capacitance structures. To date, a major focus has been on improving lifetimes of the qubits in order to allow calculations (i.e., manipulation and readout) to take place before the information is lost to decoherence of the qubits. Currently, superconducting qubit coherence times can be as high as 100 microseconds, and efforts are being made to increase the coherence times. One area of research with respect to increasing coherence times is focused on eliminating lossy materials from areas of relatively high electromagnetic field energy density such as in the vicinity of sharp corners and edges of the thin films of which the qubits are comprised. Such materials in proximity to the qubit can include imperfections that support defects known as two-level systems (TLSs).

SUMMARY

According to one embodiment, an assembly for a quantum computing device is provided. The assembly includes a quantum bus plane including a first set of recesses, a readout plane including a second set of recesses, and a block positioned to hold the readout plane opposite the quantum bus plane, such that the first set of recesses opposes the second set of recesses. Also, the assembly includes a plurality of qubit chips where each has a first end positioned in the first set of recesses and has a second end positioned in the second set of recesses.

According to one embodiment, an assembly for a quantum computing device is provided. The assembly includes a housing configured as an enclosure having a bottom part, a top part, and a block, in which the block connects the top and bottom parts. The assembly includes a quantum bus plane including a first set of recesses, and a readout plane including a second set of recesses. The block is configured to position the readout plane opposite the quantum bus plane, such that the first set of recesses opposes the second set of recesses. Also, the assembly includes a plurality of qubit chips where each has a first end positioned in the first set of recesses and has a second end positioned in the second set of recesses.

According to one embodiment, a method of configuring an assembly for a quantum computing device is provided. The method includes providing a housing configured as an enclosure having a bottom part, a top part, and a block, in which the block connects the top and bottom parts. The method includes providing a readout plane having a first set of recesses and a quantum bus plane having a second set of recesses, and assembling the readout plane opposite the quantum bus plane in a block, such that the first set of recesses opposes the second set of recesses. Also, the method includes installing a plurality of qubit chips in the block, where each of the plurality of qubit chips has a first end positioned in the first set of recesses and has a second end positioned in the second set of recesses.

In one or more embodiments, the plurality of qubit chips extends vertically in a lengthwise direction by being positioned in both the first set of recesses and the second set of recesses. The first set of recesses holds the first end of the plurality of qubit chips in the readout plane, and the second set of recesses holds the second end of the plurality of qubit chips in the quantum bus plane.

In one or more embodiments, the first end of the plurality of qubit chips is opposite the second end. In one or more embodiments, the block is made of a superconducting material.

In one or more embodiments, the quantum bus plane comprises a substrate with interconnect wiring on top of the substrate, and the interconnect wiring connects the plurality of qubit chips via a plurality of coupling bus resonators.

In one or more embodiments, the readout plane comprises a substrate with fan-out wiring on top of the substrate, and the fan-out wiring individually connects each of the plurality of qubit chips to a circuit board. The circuit board individually connects each of the plurality of qubit chips to a plurality of connectors in a one-to-one relationship.

In one or more embodiments, the block is configured to receive a first assembly comb and a second assembly comb to form an intersection, and the intersection of the first and second assembly combs forms a plurality of slots for individually accepting the plurality of qubit chips. The plurality of slots mechanically holds the plurality of qubit chips in a vertical position.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 5A through 5F illustrate an assembly and packaging technique for the modular array of vertically integrated superconducting qubit chips according to an embodiment, in which:

FIG. 5A is a schematic of an assembly illustrating assembly combs for a block;

FIG. 5B is a schematic of the assembly illustrating the assembly combs in place to form slots for orienting the superconducting qubit chips;

FIG. 5C is a schematic of the assembly illustrating the installation of the superconducting qubit chips in the slots formed by the assembly combs;

FIG. 5D is a schematic of the assembly illustrating installation of the readout plane in the block;

FIG. 5E is a schematic of the assembly illustrating a view underneath the block;

FIG. 5F is a schematic of the assembly illustrating that a pusher block applies pressure to hold the superconducting qubit chips in place;

DETAILED DESCRIPTION

Figure 1:
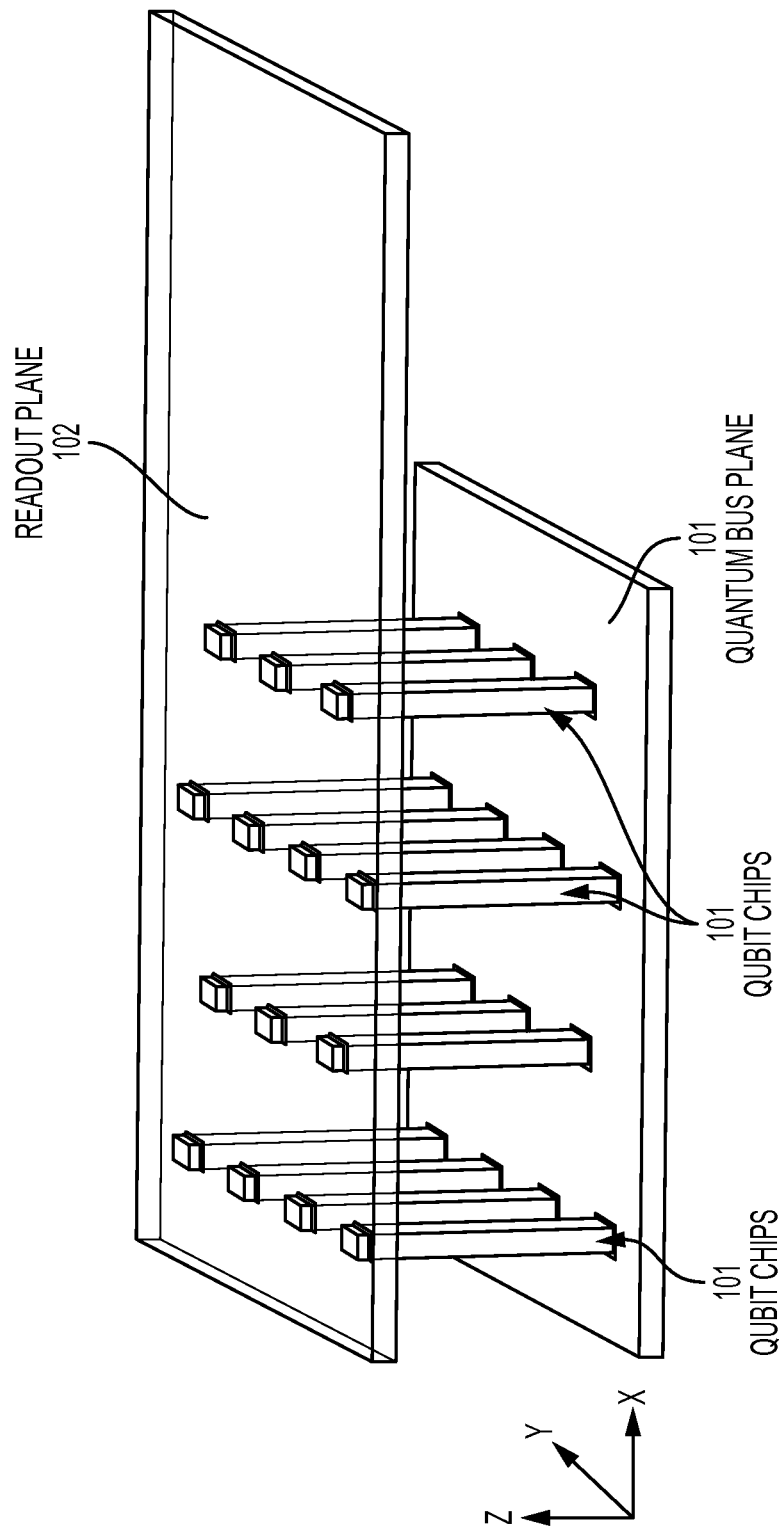
FIG. 1 is a schematic illustrating a transparent view of part of the modular array of vertically integrated superconducting qubit chips according to an embodiment.

Superconducting Josephson-junction based qubits are promising candidates for fault-tolerant quantum computing. As a solid-state technology, it has always held the potential of simpler scalability via existing integration techniques. Superconducting circuit and device fabrication can leverage well-known lithographic methods which can lead to quantum integrated processors with a high density of qubits. Furthermore, superconducting qubits operate in the microwave frequency regime, allowing for all-electrical control of the qubits and other elements which might be in the system. The other elements may include microwave resonators, active filters, quantum-limited amplifiers, etc.

A state-of-the-art fault-tolerant quantum computing architecture which has gathered interest recently is the surface code. In the surface code, qubits are arranged in a lattice with only the nearest neighbor interactions required. For superconducting qubits, the surface code is an attractive path forward as defining multiple qubits in a nearest-neighbor lattice. Moreover, the error thresholds which are required for the surface code are within reach for superconducting qubits with the current levels of coherence. One particular physical proposal in the state-of-the-art for realizing the surface code with superconducting qubits is the skew-symmetric layout. In this lattice, each superconducting qubit is coupled to two separate linking bus resonators. The coupling of superconducting qubits with microwave resonators is known as circuit quantum electrodynamics (cQED). The microwave resonators are typically defined as planar stripline resonators but can also be modes within three-dimensional (3D) waveguide cavities.

Although it may appear simple to design a large lattice of many superconducting qubits and stripline resonators lithographically, getting every resonator mode and every qubit to work as desired together is a challenge. For example, crosstalk between resonators and superconducting qubits as well as undesired spurious modes can result in stray couplings between quantum objects. Crosstalk is defined here as any unwanted coupling of microwave signals between qubit or resonator channels, other than those desired and defined by wiring. Furthermore, although it may appear easy to optimize parameters for a single qubit and a single cavity mode, once these individual qubits are re-arranged in a larger network and all defined on the same chip, their (collective) behavior can change and can be difficult to then debug.

According to embodiments discussed herein, a vertically integrated multi-chip architecture is provided, with discrete superconducting chip pieces comprised of superconducting qubits and their readout resonators. The superconducting qubits, along with their readout resonators, are then all arranged to mate in a matrix sandwiched by two larger carrier chips. These two larger carrier chips serve two purposes: one purpose is to integrate multiple resonator quantum buses to couple the superconducting qubits together (thereby coupling quantum information between qubits), and the other purpose permits physical connections via fan-out wiring to explicit microwave controls. This embodiment realizes a scalable architecture for quantum computation using well-established technology, while obviating challenging silicon integration techniques, such as thru-silicon-vias (TSVs) and multi-level lithography.

There are two physically different methods for implementing superconducting quantum processors via the circuit quantum electrodynamics (cQED) architecture, which are a 2D planar lithographic method and a 3D waveguide cavity method. The quantum processor refers to the entirety of the assembled components.

2D Planar Integration: The integration of qubits and resonators for 2D cQED is started via depositing superconducting films on silicon or sapphire substrates. Some typical superconducting films used are niobium (Nb), aluminum (Al), titanium nitride (TiN), and niobium nitride (NbN). Resonators (including readout resonators) are commonly defined in these superconducting films using coplanar waveguides, microstrips, coplanar striplines, or lumped element inductors and capacitors. Subsequently, superconducting qubits with Josephson junctions, such as the transmons, phase-qubits, or flux-qubits are also lithographically patterned via either electron-beam or optical lithography. Scaling up to larger quantum processors in this scheme requires a larger and larger chip to accommodate more resonators for coupling, more qubits, and more readout resonators. Using this 2D integration technique, processors up to 9 qubits have been devised in a linear chain, and 8 qubits in a latticed architecture. As the number of qubits in the 2D processor scales up, input-output (I/O) becomes increasingly challenging. In order to avoid crosstalk and integrate appropriate fan-out, technologies such as 3D integrated flip-chips, air-bridge crossovers, thru-silicon vias, and multi-layer lithography are required. As more and more of these different fabrication processes are required to scale up to larger quantum processors, the potential influence and degradation on the superconducting qubits increases rapidly. Therefore using these advanced fabrication techniques can lead to many different sources of decoherence in the qubits. For some of these processes, it could be necessary to perform them after Josephson junctions are lithographically defined. The impact and losses on Josephson junction based superconducting qubits after these processing steps are then a particular concern as to whether high coherence can continue to be preserved. Accordingly, this makes full-scale integration of a large system having a large number of qubits challenging.

Embodiments include various features:

1) An array of vertical superconducting qubit chips is mounted to a silicon quantum bus plane and mounted to a separate qubit addressing and readout plane.

2) A quantum bus (QB) plane lithographically is defined on silicon which permits the coupling of quantum information among individual vertical superconducting qubit chips.

3) A readout (RO) plane couples each superconducting qubit chip's readout resonator to an integrated microwave bandwidth transmission line which follows onto a flexible circuit board thus connecting each superconducting qubit chip's readout resonator a coaxial connector for input/output (I/O).

4) Vertical superconducting qubit chips each contain a single superconducting qubit (also referred to as a tunnel junction, such as a Josephson junction) and on-chip readout resonator, designed in a way to effectively couple to the quantum bus plane and the readout plane. Each individual vertical superconducting qubit chip is designed to have a specific lithographically-defined coupling capacitance between the tunnel junction to the quantum bus plane on one end and between the readout resonator and the addressing transmission line of the readout plane on the other end.

5) All silicon elements are retained within a well-thermalized metal housing (e.g., copper) which provides mechanical support, alignment, and thermal contact.

According to embodiments, the technique discussed herein is an approach for assembling the modular array of superconducting qubit chips into a scalable quantum processor, commensurate with latticed architectures for quantum error correction, such as the surface code.

Now turning to the figures, FIG. 1 is a schematic illustrating a transparent view of part of the modular array of vertically integrated superconducting qubit devices according to an embodiment. FIG. 1 shows a quantum bus plane 100, a readout plane 102, and superconducting vertical qubit chips 101. The superconducting vertical qubit chips 101 are also referred to as qubit dies, qubits, etc. The readout plane 102 and the quantum bus plane 100 sandwich the qubit chips 101 in between.

Figure 2:
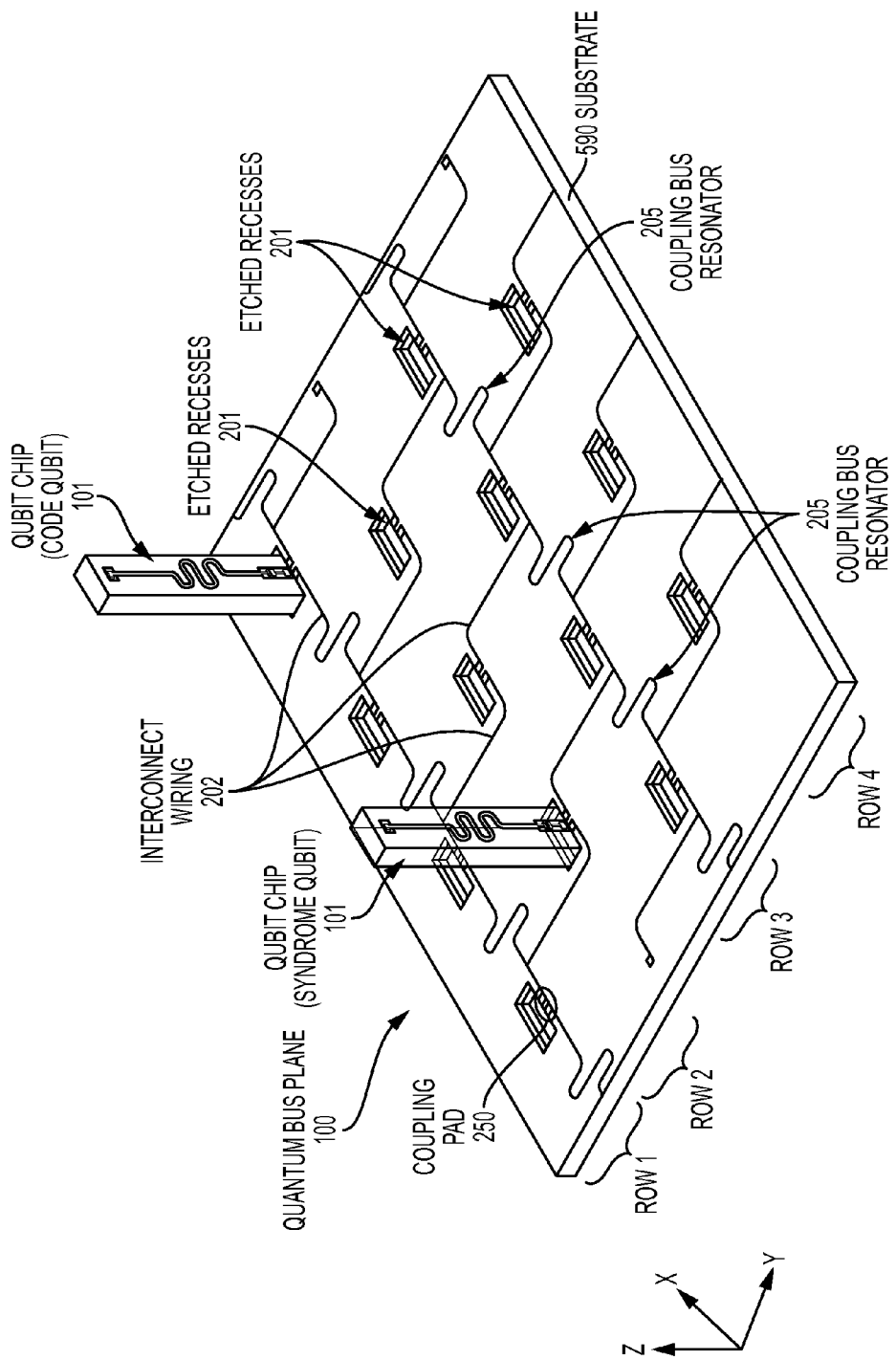
FIG. 2 is a schematic illustrating a quantum bus plane design according to an embodiment.

FIG. 2 is a schematic illustrating a quantum bus plane design of the quantum bus plane 100 according to an embodiment. The quantum bus plane design illustrates a surface code example. The quantum bus plane 100 may be made of a semiconductor material as the substrate, such as, e.g., silicon, sapphire, etc. The semiconductor material has interconnect wiring 202 deposited on top of the semiconductor material. The interconnect wiring 202 is made of a superconducting material.

Superconducting material may be defined as a material that can conduct electricity or transport electrons from one atom to another with no resistance when the superconducting material has reached "critical temperature" (Tc), or the temperature at which the material becomes superconductive. Conducting electricity or transporting electrons from one atom to another with no resistance means that no heat, sound, or any other form of energy would be released from the material as understood by one skilled in the art.

The quantum bus plane 100 connects each individual qubit chip 101 via interconnect wiring 202. The interconnect wiring 202 connects (e.g., capacitively) to each superconducting qubit chip 101 installed in the quantum bus plane 100. The interconnect wiring 202 includes coupling bus resonators 205 positioned between each superconducting vertical qubit chip 101. Particularly, superconducting vertical qubit chips 101 are configured to couple together through the coupling bus resonators 205.

Figure 4:
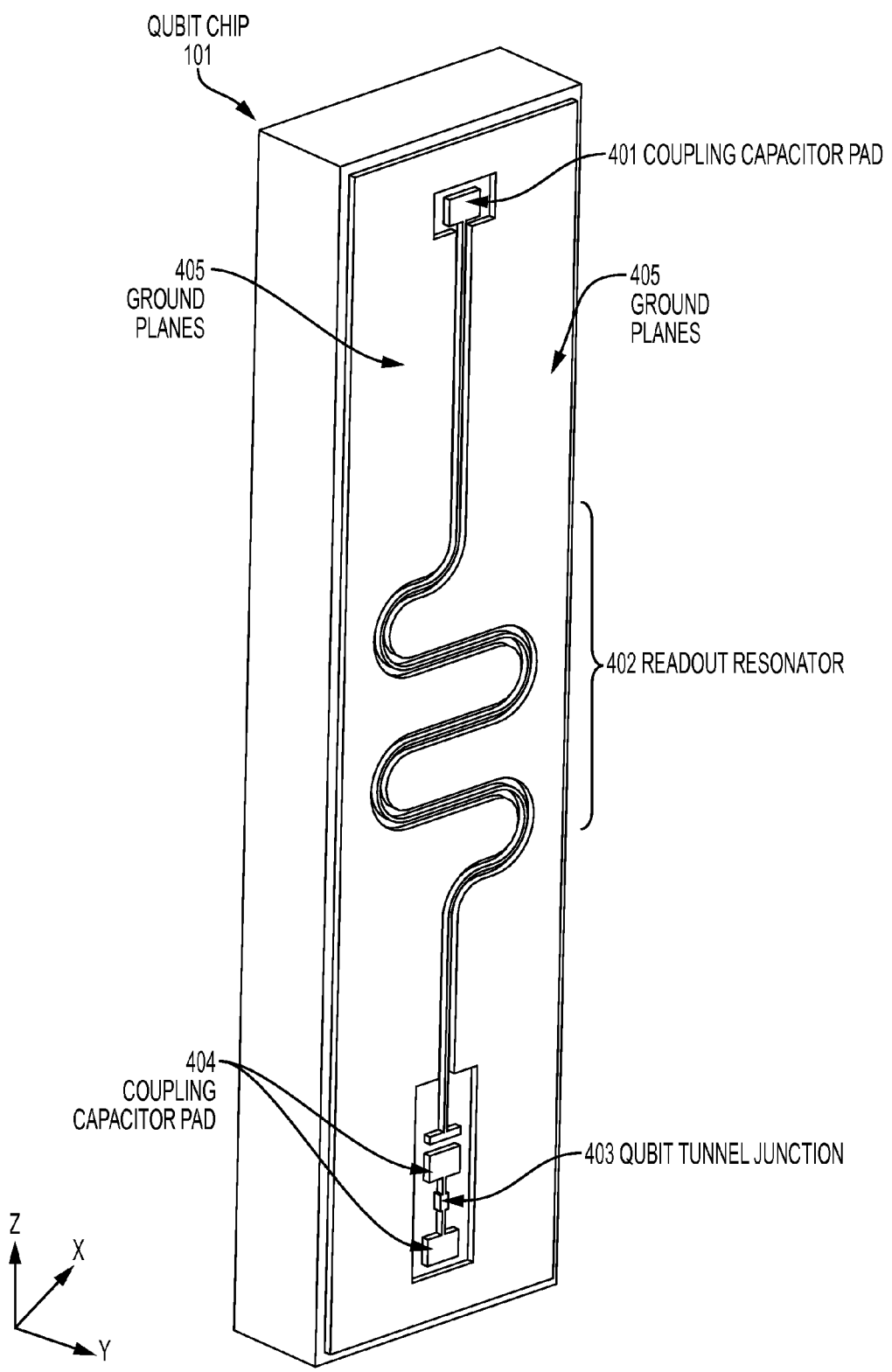
FIG. 4 is a schematic of an example qubit chip according to an embodiment.

To assist with securing and positioning superconducting vertical qubit chips 101 on the quantum bus plane 100, the quantum bus plane 100 includes etched recesses 201 at the locations to insert each of the superconducting vertical qubit chips 101. The etched recesses 201 are pockets that individually fit the superconducting vertical qubit chips 101 into specific locations in the quantum bus plane 100. The etched recesses 201 in the quantum bus plane 100 help to define accurate capacitive coupling between the qubit chips 101 and the interconnect wiring 202. The etched recesses 201 determine how deeply the vertical qubit chips 101 sit into the quantum buss plane 100 and thus determine the vertical separation between the capacitor pads on the qubit chip 101 and those on the quantum buss plane 100. The etched recesses 201 are etched into the semiconductor substrate of the quantum bus plane 100. Accurate vertical separation of these coupling pads is a prerequisite for achieving a precise coupling capacitance value. The coupling capacitor pad 404 is shown in FIG. 4 and the quantum bus plane 100 has coupling pad 250 in front of each etched recess 201.

For the sake of clarity and so as not to obscure FIG. 2, only two superconducting vertical qubit chips 101 are shown in FIG. 2 although it is understood that each row, e.g., rows 1-4, are filled with superconducting vertical qubit chips 101. One superconducting vertical qubit chip 101 is shown as a code superconducting vertical qubit chip in row 1, and the other superconducting vertical qubit chip 101 is a syndrome superconducting vertical qubit chip in row 2. In one implementation, each row may be filled with the same type of superconducting vertical qubit chip 101. For example, row 1 may be filled with code superconducting vertical qubit chips 101, while row 2 is filled with syndrome superconducting vertical qubit chips 101. Row 3 may be filled with code superconducting vertical qubit chips 101, while row 4 is filled with syndrome superconducting vertical qubit chips 101. Although only 4 rows are shown for the sake of illustration, it is contemplated that M numerous rows may be included on the quantum bus plane 100, where M is the last row. A code qubit stores quantum information for operation of the quantum processor. A syndrome qubit measures and extracts any errors in the system without corrupting the information present in the code qubit. These terms are commonly applied when discussing "surface code error correction."

Figure 3:
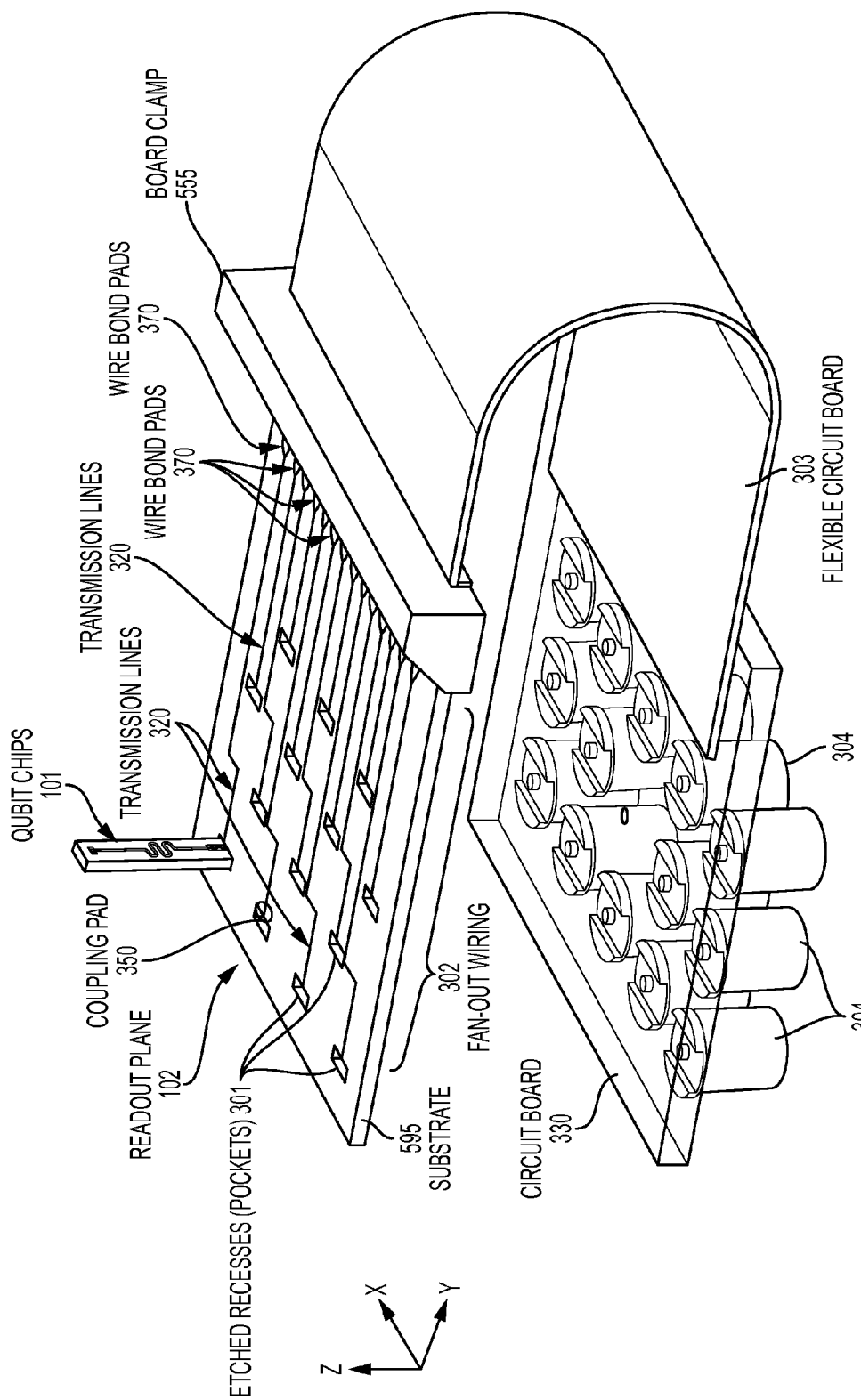
FIG. 3 is a schematic illustrating the readout plane in an inverted view according to an embodiment.

According to an embodiment, FIG. 3 is a schematic illustrating the readout plane 102 in an inverted view. FIG. 3 shows the backside of the readout plane 102, and the backside faces the quantum bus plane 100 (not shown in FIG. 3). The readout plane 102 may be made of a semiconductor material as the substrate, such as, e.g., silicon, sapphire, etc. The semiconductor material has fan-out wiring 302 deposited on top of the semiconductor material. The fan-out wiring 302 may be made of a superconducting material.

The readout plane 102 includes etched recesses 301 at locations to insert each of the superconducting vertical qubit chips 101. Each etched recess 301 is a pocket that individually fits a single superconducting vertical qubit chip 101 into a specific location in the readout plane 102, analogous to the etched recesses 201 in the quantum bus plane 100 in FIG. 2.

The etched recesses 301 in the readout plane 102 capacitively connect the superconducting vertical qubit chips 101 to the fan-out wiring 302 via the capacitor pads defined on the upper end of the vertical qubit chip 101 and on the readout plane 102. At the upper end, the vertical qubit chip 101 has coupling capacitor pad 401 as shown in FIG. 4, while the readout plane 102 has a coupling pad 350 in front of each etched recesses 301.

The fan-out wiring 302 has transmission lines 320. Each transmission line 320 individually connects to a single superconducting vertical qubit chip 101 in a one-to-one relationship. The etched recesses 301 serve both a mechanical purpose and an electrical purpose. Mechanically, the etched recesses 301 serve as a slot/pocket to insert each superconducting vertical qubit chip 101. Electrically, the etched recesses 301 align each superconducting vertical qubit chip 101 to an individual transmission line 320 of the fan-out wiring 302. The fan-out wiring 302 individually couples to each superconducting vertical qubit chip 101. Also, the fan-out wiring 302 individually connects each superconducting vertical qubit chip 101 to a flexible circuit board 303. The fan-out wiring 302 does not affect quantum information on the superconducting vertical qubit chips 101. The fan-out wiring 302 connects the superconducting vertical qubit chips 101 to the outside environment (e.g., the 50 ohm (Ω) environment). The flexible circuit board 303 individually connects each superconducting vertical qubit chip 101 to an individual connector 304 via the fan-out wiring 302. Although the flexible circuit board 303 is shown as one implementation, it is contemplated that other type of circuit boards or electrical connections may be utilized.

The connectors 304 individually connect the superconducting vertical qubit chips 101 to external electronics (not shown). The connectors 304 may be microwave connectors in which microwave signals may be input and qubit states can be read. Each connector 304 has a one-to-one relationship to a single superconducting vertical qubit chip 101 on the readout plane 102, such that each superconducting vertical qubit chip 101 is individually addressable through a single connector 304, through the flexible circuit board 303, through the fan-out wiring 302, a particular transmission line 320, and through an individual etched recess 301. In one implementation, the connectors 304 may coaxial cable connectors configured to connect to coaxial cables. Although not shown so as not to obscure FIG. 3, it is understood that conductive wiring runs through the flexible circuit board 303 and that wiring connects the flexible circuit board 303 to each respective connector 304 as understood by one skilled in the art. The conductive wiring of the flexible circuit board 303 may be made of superconducting or normal material.

FIG. 4 is a schematic of an example superconducting vertical qubit chip 101 according to an embodiment. Various details of the superconducting vertical qubit chips 101 are shown in FIG. 4. The superconducting vertical qubit chips 101 may have a substrate made of a semiconductor material, such as, e.g., silicon, sapphire, etc. Each qubit chip 101 is an integrated circuit. Conductive material is deposited and patterned on the substrate of the superconducting vertical qubit chips 101 to form the integrated circuit. The superconducting vertical qubit chips 101 are not a monolithic wafer. Rather, the superconducting vertical qubit chips 101 are formed from a wafer (substrate) diced into individual qubit dies. Each diced superconducting vertical qubit chip 101 includes a coupling capacitor pad 401. The coupling capacitor pad 401 is a capacitor that capacitively couples each superconducting vertical qubit chip 101 to the readout plane 102 via the fan-out wiring 302, when the superconducting vertical qubit chip 101 is inserted in its etched recess 201. Accordingly, on one end of the superconducting vertical qubit chip 101, that end is electrically connected to the readout plane 102 through the coupling capacitor pad 401 and coupling pad 350 on the readout plane 102. It is noted that, for coupling capacitor pads 401 and 350 and coupling capacitor pads 404 and 250, the coupling capacitors may be defined by metal pads that are at right angles to each other, with a well-defined vertical separation. The two types of coupling capacitors are quantum buss plane to lower side of qubit chip, and upper side of vertical qubit chip to readout plane. It should be understood that two metal surfaces (pads in this case) at right angles to each other, separated by some distance, define a capacitor. Embodiments exploit this fact to permit accurate coupling between circuit elements without resorting to wire bonds across right angle connections.

Additionally, each superconducting vertical qubit chip 101 includes coupling capacitor pads 404. The coupling capacitor pads 404 form a capacitor, and between the two coupling capacitor pads 404 is a tunnel junction 403 (sometimes called the qubit), such as, e.g., a Josephson junction. The coupling capacitor pads 404 form a capacitor that capacitively couples to the quantum bus plane 100 via the interconnecting wiring 202. Accordingly, on the opposite end to the coupling capacitor pad 401, the opposite end is electrically connected to the quantum bus plane 100 through the coupling capacitor pads 404.

The superconducting vertical qubit chip 101 includes readout resonator 402. The readout resonator 402 is configured with a resonance frequency designed to read the state of the qubit tunnel junction 403. The readout resonator 402 is positioned between the coupling capacitor pad 401 and the coupling capacitor pads 404. The readout resonator 402 is formed of conductive material that connects the coupling capacitor pad 401 and the coupling capacitor pads 404. The conductive material is a superconducting material, which forms the circuit.

The superconducting vertical qubit chip 101 includes a ground plane 405 surrounding the circuit of the coupling capacitor pad 401, the coupling capacitor pads 404, and the readout resonator 402. The material of the substrate separates the ground plane 405 from the circuit.

Figure 5A:
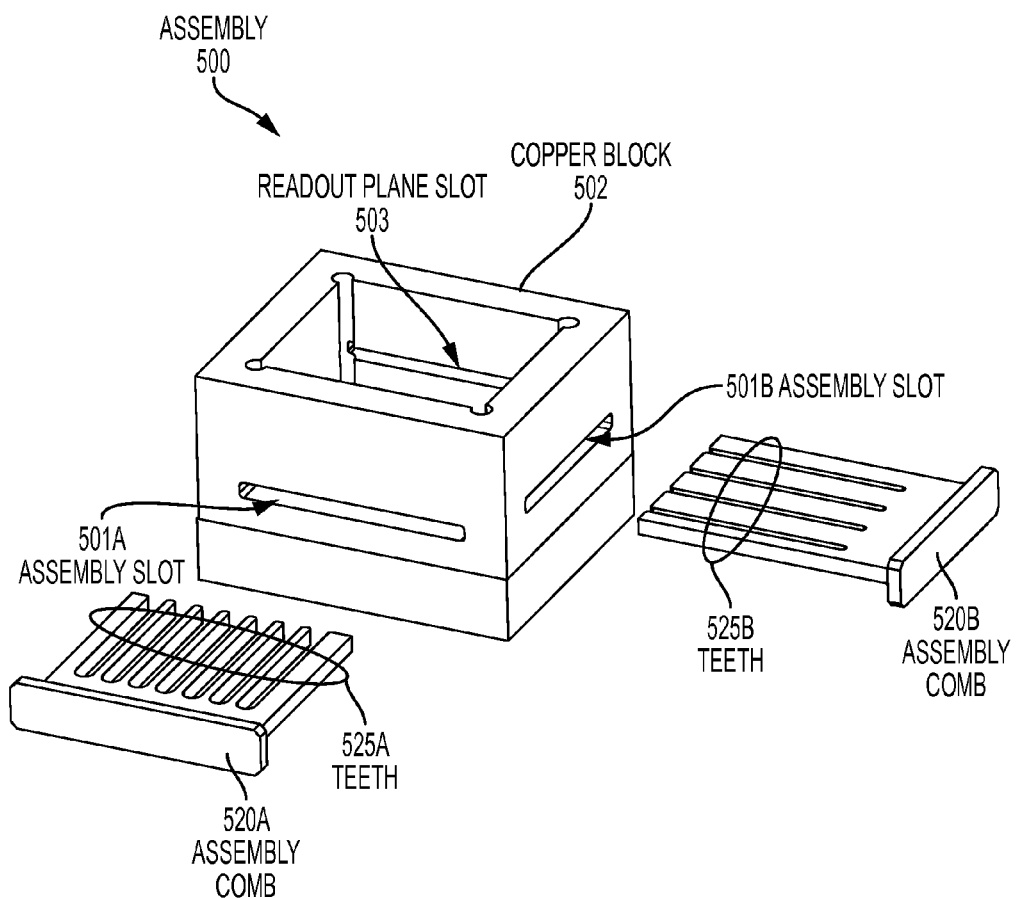

According to an embodiment, an assembly and packaging technique for the modular array of vertically integrated superconducting qubit chips 101 is discussed below in FIGS. 5A, 5B, 5C, 5D, 5E, and 5F. FIG. 5A illustrates part of an assembly 500. The assembly 500 has a copper block 502. The copper block 502 includes a readout plane slot 503. The readout plane 102 is to be inserted into the readout plane slot 503 as discussed further below. Although a copper block 502 is illustrated, the block 502 may be made of other materials. The block 502 can be constructed of a variety of materials provided they give high thermal conductivity. Examples other than copper include brass, sapphire, silicon, silver, aluminum, and/or niobium.

Assembly combs 520A and 520B are utilized to orient alignment of the superconducting vertical qubit chips 101 for assembly with the readout plane 102 (in the etched recesses 201) and quantum bus plane 100 (in the etched recesses 301) within the copper block 502. Both assembly combs 520A and 520B have teeth with predefined spacing. For example, the assembly comb 520A has teeth 525A and the assembly comb 520B has teeth 525B. In one implementation, the spacing of the teeth 525A is larger than the spacing of the teeth 525B, and the spacing of the teeth 525A and 525B is based on accommodating the cross-section size of the superconducting vertical qubit chips 101.

The copper block 502 includes assembly slots 501A and 501B. The assembly comb 520A is inserted into the assembly slot 501A, and the assembly comb 520B is inserted into the assembly slot 501B. One assembly slot is positioned higher than the other assembly slot such that the assembly combs 520A and 520B define the desired alignment slots where they cross over and under each other but do not interfere with each other when inserted into their respective assembly slots 501A and 501B.

Figure 5B:
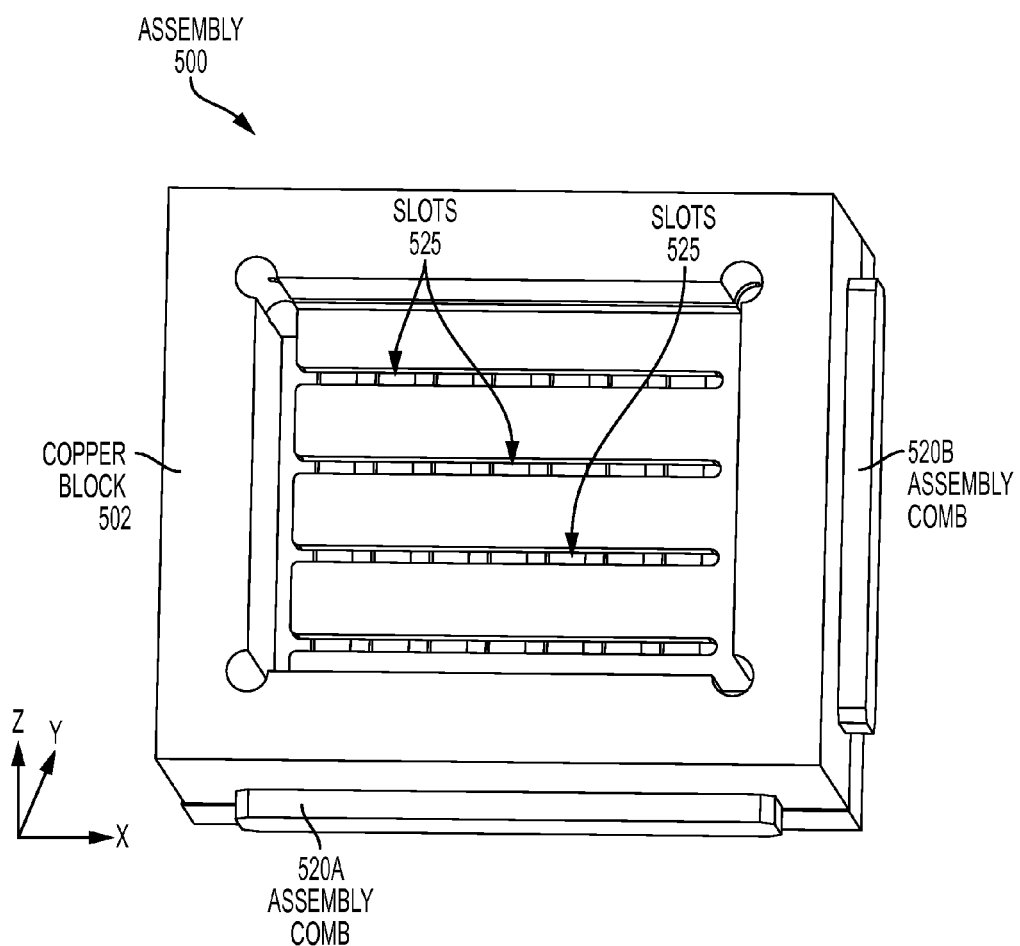

FIG. 5B is a schematic of the assembly 500 showing the assembly combs 520A and 520B in place within the copper block 502 according to an embodiment. Slots 525 are formed by the intersection of the assembly combs 520A and 520B while in the copper block 502. The slots 525 are utilized to orient the superconducting vertical qubit chip 101. In particular, the slots 525 are formed by the spacing of the teeth 525A and 525B such that the slots 525 can accommodate the size of the superconducting vertical qubit chips 101. In one implementation, the spacing of the slots 525 may be about 5 millimeters (mm) in the x-axis and may be about 5 mm in the y-axis. In one implementation, each superconducting vertical qubit chip 101 may have approximate dimensions of 8 mm tall by 2 mm wide by 0.7 mm thick.

Also, to accommodate the size of the superconducting vertical qubit chips 101, the etched recesses 201 and 301 may be about 0.7 mm in the x-axis and about 2 mm in the y-axis. The etched recessed 201 and 301 may have a depth of about 0.35 mm in the z-axis.

Figure 5C:
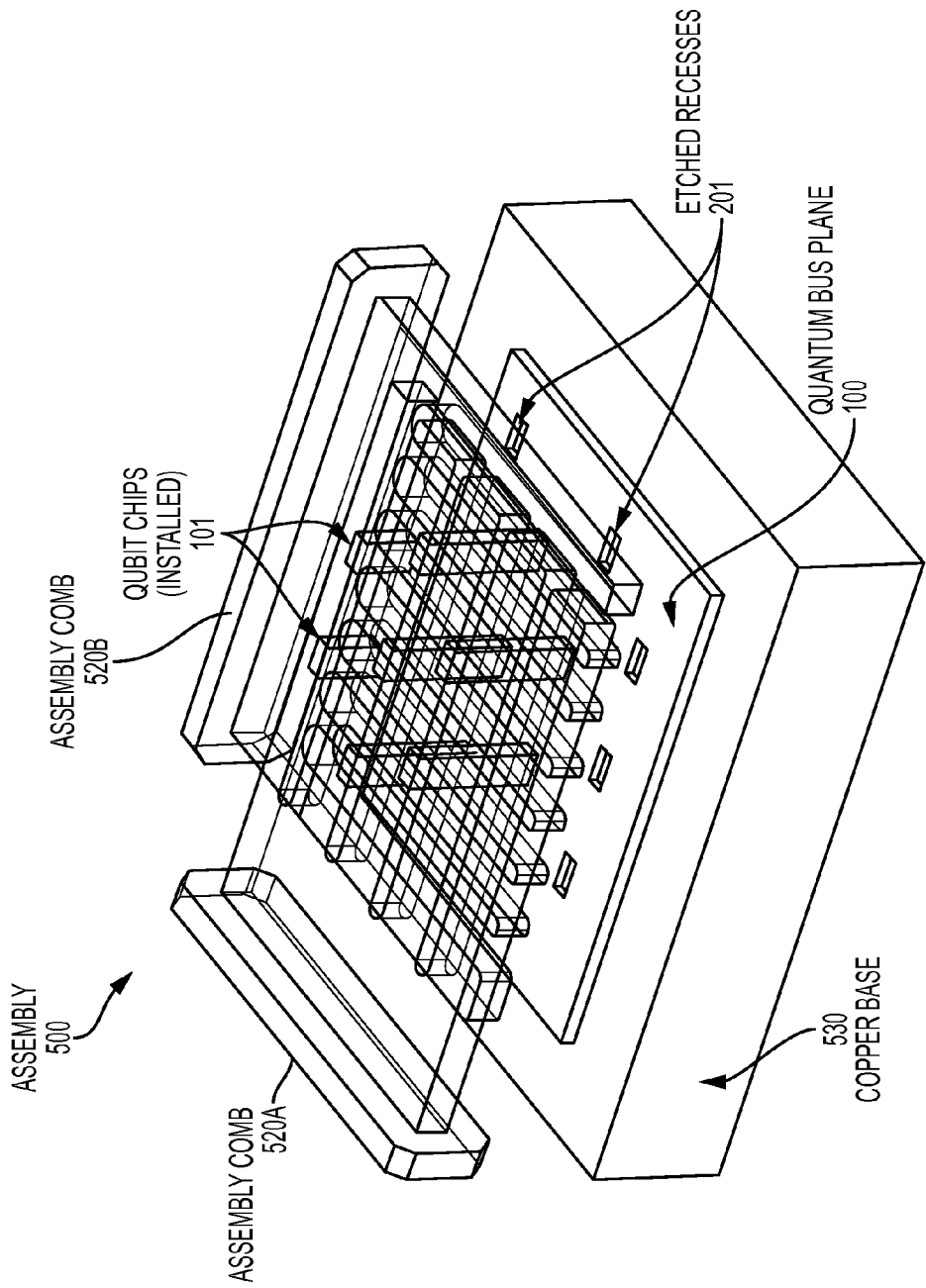

FIG. 5C is a schematic of the assembly 500 showing an abbreviated view inside the copper block 502 (not shown) which is part of a housing 550 (shown in FIG. 5F) according to an embodiment. In FIG. 5C, the abbreviated view omits certain elements in order to simplify the assembly 500 for better understanding. The walls of the housing copper block 502 are removed, and only a copper base 530 of the housing 550 is shown. The quantum bus plane 100 is attached to and/or positioned on the copper base 530. The intersecting assembly combs 520A and 520B are in place (within the copper block 502) forming the slots 525. Aligned through the slots 525, a few example superconducting vertical qubit chips 101 are installed into (the etched recesses 201 in) the quantum bus plane 100. The slots 525 directly align to individual etched recesses 201 below and provide a guide during installation of the superconducting vertical qubit chips 101.

Figure 5D:
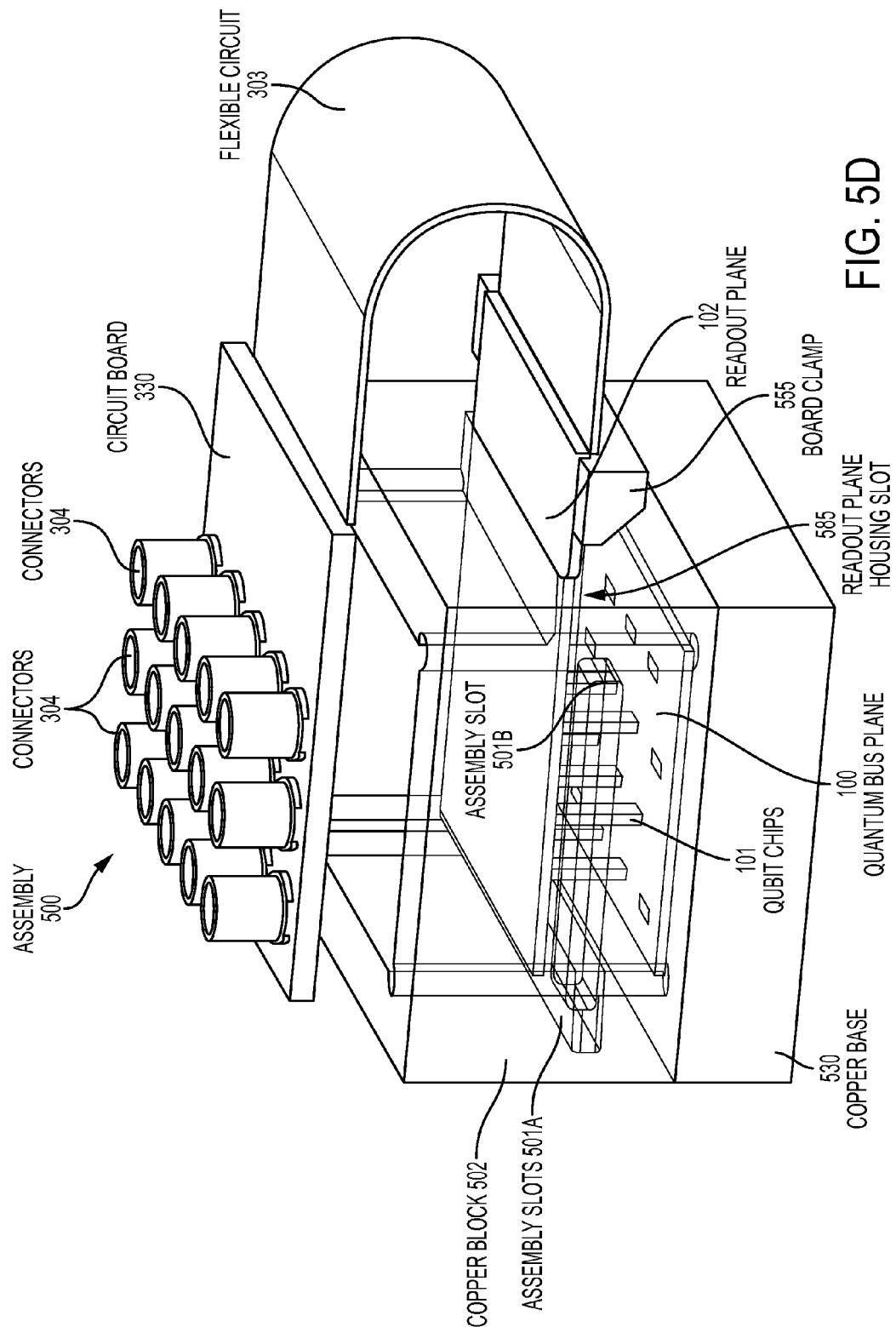

FIG. 5D is a schematic of the assembly 500 showing a transparent view into the copper block 502 according to an embodiment. FIG. 5D shows the readout plane 102 installed into the copper block 502 and extending outside of the copper block 502 through readout plane housing slot 585. In one implementation, the quantum bus plane 100 fits into the bottom of the copper block 502. In another implementation, the copper block 502 may sit on top of the quantum bus plane 100. The superconducting vertical qubit chips 101 are sandwiched between the readout plane 102 and the quantum bus plane 100, and the ends of the superconducting vertical qubit chips 101 fit into the etched recesses 201 and 301 of the quantum bus plane 100 and readout plane 102, respectively. For simplicity and ease of understanding, only a few superconducting vertical qubit chips 101 are shown in FIG. 5D. Also, so as not to obscure FIG. 5D, the assembly combs 520A and 520B are not shown in this figure.

A board clamp 555 holds and attaches to portion of the readout plane 102 extending outside of the housing. The board clamp 555 holds and attaches the readout plane 102 to the flexible circuit board 303. Outside of the housing 550, the connectors 304 are on a rigid circuit board 330 and connected to the flexible circuit board 303. The circuit board 330 comprises circuits (not shown) individually connecting each connector 304 to an individual circuit within the flexible circuit board 303, as understood by one skilled in the art.

Figure 5E:
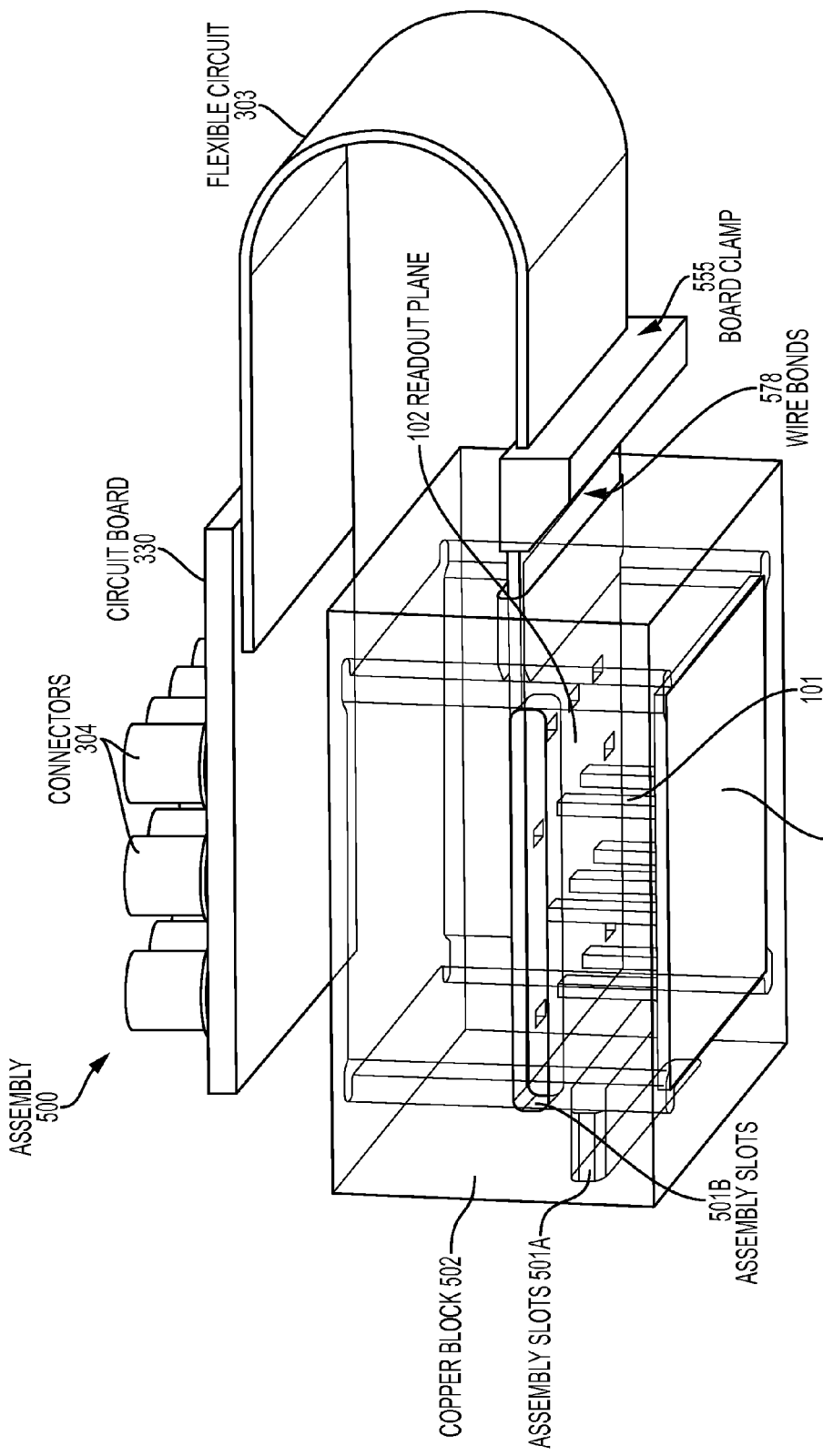

FIG. 5E is a schematic of the assembly 500 showing a view underneath the housing 500 according to an embodiment. The copper base 530 of the housing is removed. FIG. 5E allows the bottom of the quantum bus plane 100 to be viewed.

FIG. 5E also shows that wire bonds 578 connect the readout plane 102 to the board clamp 555. These wire bonds 578 create an electrical connection between the fan-out wiring 302 on the readout plane 102 and the conductors (of whatever type) on the flexible circuit board 303. Although it possible to mechanically bond the flexible circuit board 303 directly to the silicon readout plane 102, those two items, however, have extremely different thermal expansion coefficients which may cause the connections to break over time. Wire bonds 578 being flexible permit long-term reliability over many thermal cycles. In one implementation, the two readout planes are to be made of the same material so any dimensional changes from thermal expansion are the same for both planes.

Figure 5F:
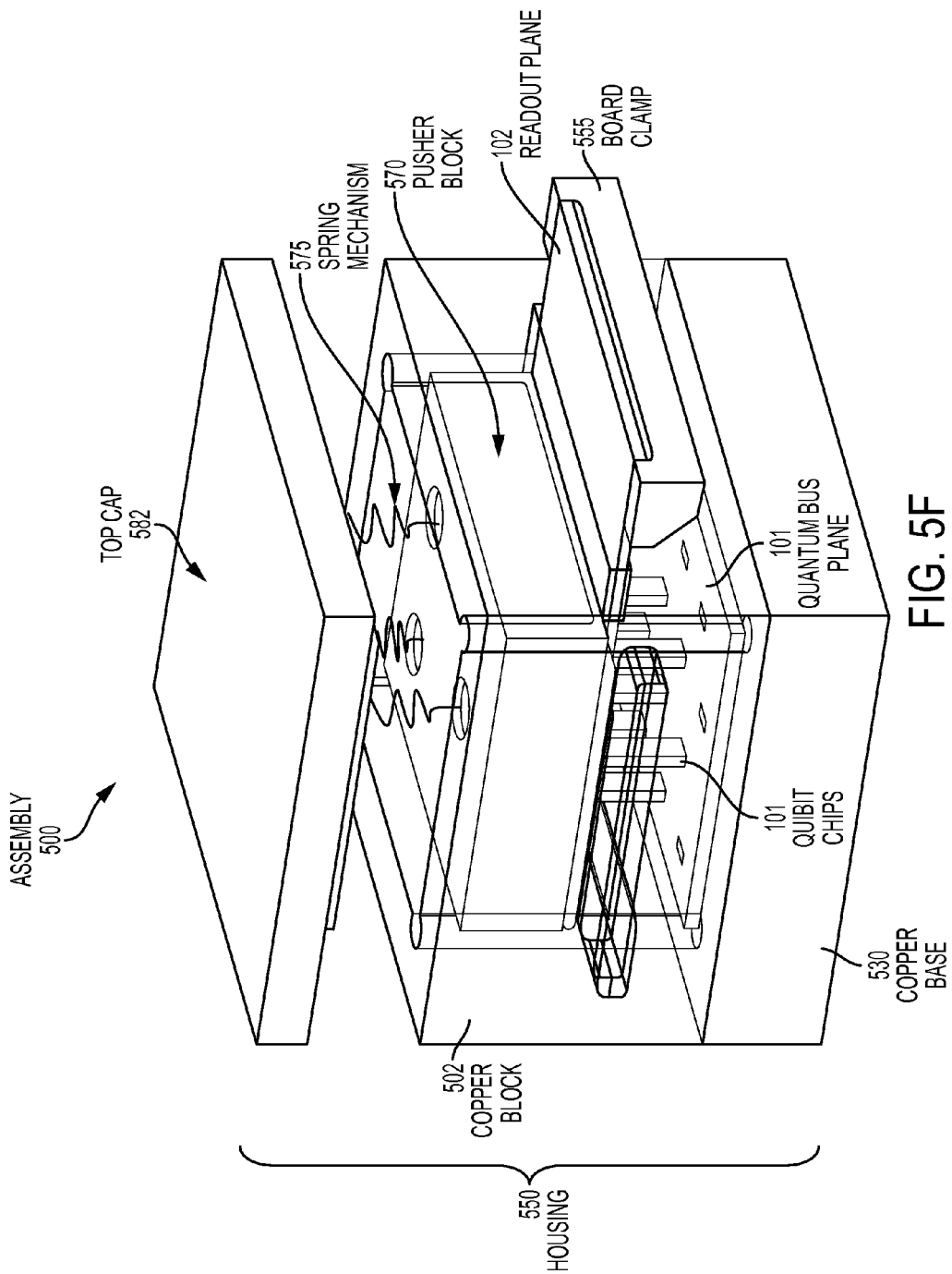

FIG. 5F is a schematic of the assembly 500 according to an embodiment. FIG. 5F shows that a pusher block 570 pushes the readout plane 102 firmly against the superconducting vertical qubit chips 101. The pusher block 570 is spring loaded. The constant pressure of the pusher block 570 ensures that the superconducting vertical qubit chips 101 stay in the etched recesses 201 and 301. The force of the pusher block 570 is caused by a spring mechanism 575 attached to a top cap 582 of the housing 550.

As can be seen in FIG. 5F, the housing 550 is an enclosure. The housing 550 may be made of copper, silver, brass, silicon, sapphire, aluminum, and/or niobium. The housing 550 includes the copper block 502, the copper base 530, the pusher block 570, and the top cap 582.

In one implementation, the assembly combs 520A and 520B may remain in the copper block 502 after the superconducting vertical qubit chips 101 have been installed (i.e., inserted into the etched recesses 201 and 301 of the quantum bus and readout planes 100 and 102, respectively). In another implementation, the assembly combs 520A and 520B may be removed from the copper block 502 after installing the superconducting vertical qubit chips 101, such that the assembly combs 520A and 520B are not in the housing 550.

For ease of understanding, sub-headings are provided below. The sub-headings are meant for explanation purposes and not limitation.

Standardized Fabrication of Elements:

Each of the discussed silicon elements, such as, e.g., the quantum bus plane 100, superconducting vertical qubit chips 101, and readout plane 102, use well-established lithographic technology that is time tested in the superconducting qubit community and thus understood by one skilled in the art. In one embodiment, the materials are standardized to niobium for the resonator and transmission line elements; the materials are aluminum and native aluminum oxide for the qubit junction fabrication (i.e., the qubit tunnel junction 403) via standard double-angle evaporation. All lithography may be performed on high-resistivity silicon wafers with established loss parameters appropriate for qubit technology, as understood by one skilled in the art.

The readout resonator 402 is in on the vertical qubit chip 101, and transmission line elements are any other wiring on the quantum buss plane 100, the qubit chip 101, and the readout plane 102. In one implementation, the readout resonators 402 may be of a different material than the wiring. In another implementation, the readout resonators 402 and wiring may be fabricated from a variety of all the same materials. In yet another implementation, the readout resonators 402 and various different portions of the wiring may be fabricated from a variety of different materials for each sub-category of function.

Complete assembly of a scalable quantum processor with N qubits (i.e., N qubit chips 101) is achieved without resorting to any multi-level lithography, inserted ground planes, cross-overs, or thru-silicon-vias (TSVs). Using current standard lithographic techniques, embodiments allow the straightforward integration of N=100 to 1000 superconducting vertical qubit chips 101, taking up a space roughly the size of a deck of playing cards (e.g., 2.5×3.5 inches or 64×89 mm).

Design of Individual Qubit Chips and Coupling Capacitance Choices:

From electromagnetic simulations for reasonable parameters of qubit tunnel junctions 403, readout resonators 402, and quantum bus planes 100, it is possible to achieve the desired precise coupling capacitance values with the geometry described herein.

Each individual superconducting vertical qubit chip 101 contains a capacitor (i.e., coupling capacitor 404) that couples signal to the quantum bus traces (i.e., interconnect wiring 202) on the quantum bus plane 100. The capacitor (coupling capacitor 404) provides coupling that is appropriate for a specific universal two-qubit entangling gate. The capacitor is formed by an electrode on the lower end of the vertical qubit chip 101 which couples to electrodes on the quantum buss plane 100. The approximate range in this implementation for the capacitor value is around 7 to 5 femto Farads. The interconnection between the superconducting vertical qubit chip 101 and the etched recesses 201 (pocket) in the quantum bus plane 100 is designed to minimize stray coupling between the qubit signals and ground plane 405.

On the other end of the superconducting vertical qubit chip 101, the interconnection with the readout plane 102 creates a specific capacitance between the readout resonator 402 and the control transmission line 320 (of the fan-out wiring 302) such that the readout resonator 402 has a well-defined quality factor and permits a high fidelity readout. This capacitor (i.e., coupling capacitor pad 401) is formed by an electrode on the superconducting vertical qubit chip 101 (qubit die) which couples to an electrode (a portion of the control transmission line 320) on the readout plane 102. The approximate value of this capacitor in this implementation is around 5 to 7 femto Farads, for example.

Each superconducting vertical qubit chip 101 is metalized on the backside with superconductor material to control stray coupling and other electric fields within the processor housing 550. The backside of the superconducting vertical qubit chip 101 is opposite the circuit of the coupling capacitor pad 401, the coupling capacitor pads 404, and the readout resonator 402 on the front side.

Note that all capacitor values and uncertainty are determined by lithographic feature sizes and depth of etches. These values are easily changed and provide for sufficient accuracy for the circuit tolerances required for embodiments.

Design of Quantum Bus Plane:

The fabrication process of the quantum bus plane 100 can begin with standard 2D integration techniques. In one implementation, niobium is electro-sputtered onto a silicon substrate 590. Multiple masks, having the quantum bus designs and having the etched recesses 201 (pockets) where qubit chips 101 are to be mounted, may be used for reactive ion etching (RIE) of the niobium. The quantum bus design mask defines the coupling bus resonators 205 which couple quantum information among the superconducting vertical qubit chips 101. The pocket mask (for making the etched recesses 201) defines the locations to etch down into the silicon for the individual superconducting vertical qubit chips 101 to be mounted. The process for the pocket mask etch may be similar to most 3D integration schemes, except in this case the sputtered niobium is used as a hardmask to first define the pockets (i.e., etched recesses 201). Definition of the pocket (i.e., etched recess 201) in the silicon substrate 590 can be achieved using a deep silicon dry etch process, reactive ion etching (RIE), or a wet chemistry (tetramethyl ammonium hydroxide (TMAH)).

The pockets (i.e., etched recesses 201) of the quantum bus plane 100 are arranged in a grid structure where successive rows are offset, one corresponding to superconducting vertical code qubit chips, and the other row corresponding to superconducting vertical syndrome qubits chips 101 for error detection via measurement. Each qubit chip pocket (i.e., etched recess 201) is arranged to couple to two coupling bus resonators 205 defined on the quantum bus plane 100 in one implementation. Note that this arrangement is not the only way to realize the surface code, as one can also couple either three or four coupling bus resonators 205 to a single superconducting vertical qubit chip 101 in another implementation. Location accuracy of the qubit chip pockets (etched recesses 201 (including etched recesses 301 in readout plane 102) is determined by the lithography and depth accuracy as determined by the etch time. The pockets are formed with a chamfered or bell-mouthed opening to allow easy insertion of each superconducting vertical qubit chip 101 (qubit die).

Depending on results from scaling to larger N (i.e., a larger amount of superconducting vertical qubit chips 101), the quantum bus plane 100 may be admissible to more integration techniques such as TSVs for chip-mode reduction. The nuance here is that no Josephson junctions (qubits) 403 need to be defined in this quantum bus plane 100, so there would be minimal effect on qubit coherence with further integration of the quantum bus plane 100.

Design of Readout Plane:

The readout plane 102 starts off similar to the quantum bus plane 100, with niobium conductors etched lithographically on a silicon substrate 595. Co-planar transmission lines 320 are patterned on the readout plane 102 in a fan-out configuration (i.e., fan-out wiring 302) so as to bring external signals into and out of each superconducting vertical qubit chip 101. These transmission lines 320 are defined in a coplanar waveguide, and support 50Ω microwave driving of both readout and qubit control signals.

All these transmission lines 320 meander through the readout plane 102 terminating on one edge in wire bond pads 370. The wire bond pads 370 are on the extreme right end of the fan-out wiring 302. Similar to the quantum bus plane, pockets (i.e., etched recesses 301) in the readout plane 102 are likewise defined via deep etching into the silicon substrate 595 of the readout plane 102, in corresponding locations as the etched recesses 201 in the quantum bus plane 100 so as to accept the mounting of the individual superconducting vertical qubit chips 101. These pockets (i.e., etched recesses 301) may be chamfered or otherwise bell-mouthed for ease of assembly and locating of structure.

The microwave signals for control and readout are carried off the readout plane 102 via wire bonds 578 to the flexible circuit board 303 which conducts to other transmission lines embedded in a separate rigid circuit board 330 populated with connectors 304 leading to external components.

Ground Planes in Quantum Bus Plane and Readout Plane Pockets:

After etching qubit chip pockets (etched recesses 201, 301) in both the quantum bus and readout planes 100 and 102 respectively, these pockets (etched recesses 201, 301) are coated with niobium via sputtering to form continuous ground plane. These ground planes are designed to mate to the ground planes 405 that exist on the extreme ends of each superconducting vertical qubit chip 101 to form a continuous electrostatic ground between the quantum bus and readout planes 100 and 102, respectively; the continuous electrostatic ground between the quantum bus and readout planes 100 and 102 (respectively) serves to (1) further isolate each qubit site (i.e., locations of etched recesses 201, 301) from spurious modes, (2) isolate each qubit site (i.e., locations of etched recesses 201, 301) from adjacent qubit superconducting vertical qubit chips 101, and (3) eliminate unwanted cross-talk coupling between superconducting vertical qubit chips 101.

Assembly of Modular Array Elements:

1. Each individual superconducting vertical qubit chip 101 is located by an etched recess 201 formed in the quantum bus plane 100 and an etched recess 301 formed the readout plane 102. In one implementation, the etched recesses 201, 301 are accurately formed in the silicon substrates 590, 595 using a standard wet etch process.

2. Each individual superconducting vertical qubit chip 101 is chosen for desirable electrical characteristics such as transition frequency. In some cases the syndrome qubits might be more strongly coupled to the readout wiring to enhance signal-to-noise. This would reduce coherence times on the syndrome qubits which does not in any way degrade the quantum information in the code qubits.

3. A pair of crossed assembly combs 520A and 520B is mounted to the outer housing of the copper block 502 in order to temporarily provide alignment for the superconducting vertical qubit chips 101 (as shown in FIG. 5A). The assembly combs 520A and 520B create a series of alignment slots 525 (as shown in FIG. 5B) to orient the superconducting vertical qubit chips 101 which are inserted vertically from above. The superconducting vertical qubit chips 101 key into the etched recesses 201 in the quantum bus plane 100 (as shown in 5C) and are thereby (automatically) oriented to key into the corresponding etched recesses 301 in the readout plane 102 (as shown in FIG. 5D). The readout plane 102 is inserted from the side via readout plane slot 503. FIG. 5E depicts the assembly 500 from below and shows the assembled components with the assembly combs 520A and 520B omitted. Once assembled, the vertical organization of the superconducting vertical qubit chips 101 constrained (and sandwiched) between the two silicon quantum bus and readout planes 100 and 102 (respectively) is maintained with pressure applied by the pusher block 570. The pusher block 570 is spring-loaded from above via the springs 575 pressed down by the top cap 582 (as shown in FIG. 5F).

Expandable, Scalable and Replaceable Array:

The figures associated with embodiments show a fourteen qubit chip array but the number of superconducting vertical qubit chips 101 can be expanded to any arbitrary number (N). All that is required is that the quantum bus plane 100 should be enlarged and the niobium wiring be replicated at all qubit sites (i.e., locations at the etched recesses 201 to accommodate superconducting vertical qubit chips 101) as needed. The readout plane 102 can support many signal transmission lines 320 interleaved between each qubit site (i.e., locations at the etched recesses 301 to accommodate superconducting vertical qubit chips 101) to bring the signals to one edge and may require integration of dielectric cross-overs to reduce crosstalk if desired. Moreover, the further integration of the readout plane 102 and quantum bus planes 100 is a minimal issue as it will neither directly affect the qubit chip fabrication process nor the qubit coherence performance.

According to embodiments, the assembly 500 includes the desirable feature that each superconducting vertical qubit chip 101 may be hand-selected for the correct electrical characteristics; any member of the array of superconducting vertical qubit chips 101 may be individually replaced at any time if the qubit chip's performance degrades for any reason during operation. Replacement of the superconducting vertical qubit chip 101 can be accomplished without removing wire bonds 578 and/or without having to unsolder any components.

Embodiments provide a clear separation of fabrication processing steps and avoid the need for all N qubit and circuit parameters to meet specification on a single superconducting vertical qubit chip 101. Qubit chips 101 from multiple different fabrication runs can be combined in this type of quantum processor so that parameters such as transition frequency may be easily tailored without having to achieve a full range of accurate parameters on one silicon wafer in just one fabrication run. Individual qubit chips 101 may be chosen from various different fabrication runs (wafers) and combined in the processor assembly.

As understood by one skilled in the art, microwave signals are applied to the qubit chip 101 via the readout lines to excite it into a defined state. After some later time the state of the qubits can be then read out by interrogating them at some other microwave frequency, again via the readout lines.

Figure 6:
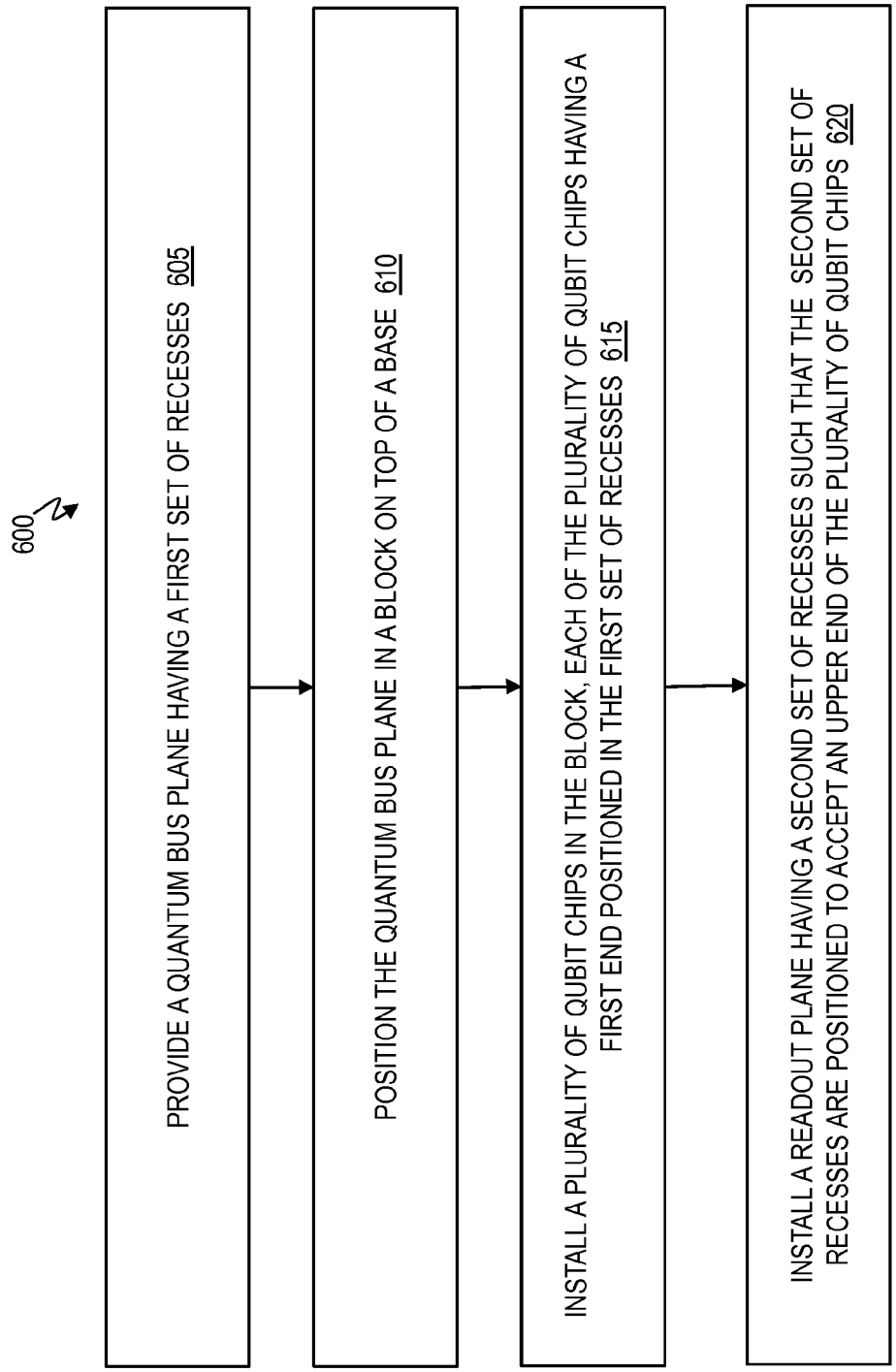
FIG. 6 is a method of configuring an assembly according to an embodiment.

FIG. 6 is a method 600 of configuring an assembly 500 for a quantum computing device according to an embodiment. Reference can be made to the figures discussed herein.

At block 605, the quantum bus plane 100 having a first set of recesses 201 are provided, as depicted in FIG. 2.

At block 610, the quantum bus plane 100 is positioned in the block 502, on top of the copper base 530, as seen in FIG. 5D. The alignment combs 520A and 520B are installed in the copper block 502 and fixed in place, creating a series of precisely aligned slots 535 to accept the qubit chips 101, as seen in FIG. 5B.

At block 615, a plurality of superconducting vertical qubit chips 101 are placed/installed in the block 502, each of the plurality of qubit chips 101 has a first end positioned in the first set of recesses 201 (as shown in FIG. 5C). The plurality of qubit chips 101 extend vertically in a lengthwise direction by being positioned in the first set of recesses 201 and in the slots 525 created by the alignment combs. The set of recesses 201 holds the lower end of the plurality of qubit chips 101 in the quantum bus plane 100. The first end of the plurality of qubit chips 101 is opposite the second end.

At block 620, the readout plane 102 with its recesses 301 is then installed into the copper block 502 such that the recesses 301 in the readout plane 102 are positioned to accept the upper end (i.e., second end) of the plurality of all the qubit chips 101 which have been aligned by the slots 525 created by both alignment combs 520A, 520B. The readout plane 102 thus drops down over the ends of the qubit dies 101 a distance equal to the depth of the recesses in the readout plane 301 and the precise mechanical alignment of all the electrical circuit elements is achieved in all three axes simultaneously. At this point the alignment combs 520A and 520B may either be left in place or may be removed.

The quantum bus plane 100 comprises a substrate 590 with interconnect wiring 202 on top of the substrate 590, and the interconnect wiring 202 connects the plurality of qubit chips 101 via a plurality of coupling bus resonators 205. The readout plane 102 comprises a substrate 595 with fan-out wiring 302 on top of the substrate 595, and the fan-out wiring 302 individually connects each of the plurality of qubit chips 101 to a circuit board 330. The circuit board 330 individually connects each of the plurality of qubit chips 101 to a plurality of connectors 304 in a one-to-one relationship.

The block 502 is configured to receive a first assembly comb 520A and a second assembly comb 520B to form an intersection, and the intersection of the first and second assembly combs 520A, 520B form a plurality of slots 525 for individually accepting the plurality of qubit chips 101. The plurality of slots 525 mechanically holds the plurality of qubit chips 101 in a vertical position.

Figure 7:
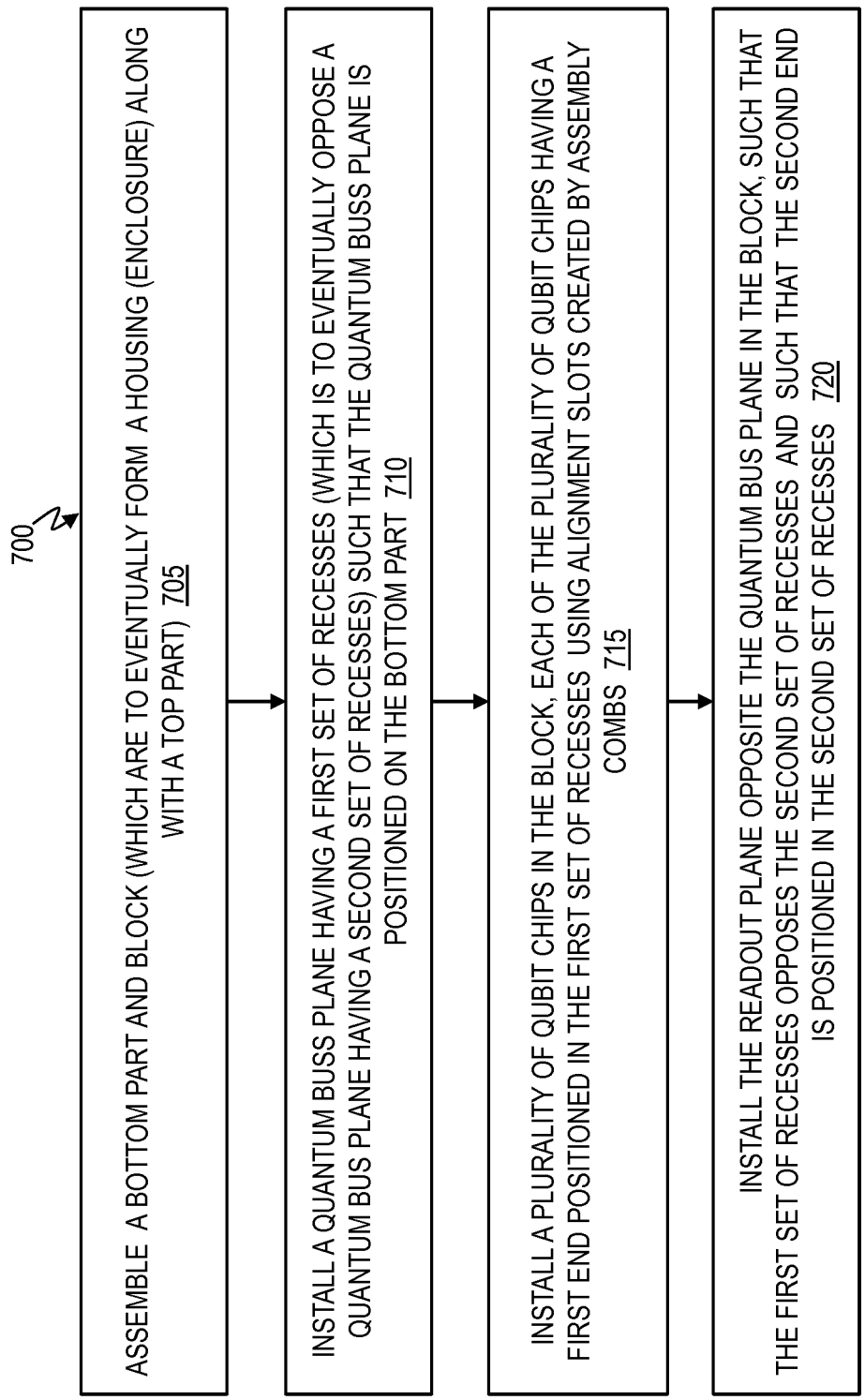
FIG. 7 is a method of configuring an assembly according to an embodiment.

FIG. 7 is a method 700 of configuring an assembly 500 for a quantum computing device according to an embodiment. Reference can be made to the figures discussed herein.

At block 705, the following parts are assembled: copper base 530 and copper block 502.

At block 710 the quantum buss plane 100 is installed into the copper block 502 such that the quantum buss plane 100 rests on top of the copper base 530, and the quantum bus plane 100 has a set of recesses 201 (the readout plane 102 has a different set of recesses 301). Then, the assembly combs 520A and 520B are installed and fixed into the copper block 502 thereby creating alignment slots 525.

At block 715, a plurality of qubit chips 101 are installed in the block 502, where each of the plurality of qubit chips 101 has a first end positioned in the first set of recesses 201 using the alignment slots 525 created by the assembly combs 520A, 520B to guide the qubit chips 101 into the correct locations. The housing 550 includes a readout plane housing slot 585. At block 720, the readout plane 102 is installed into the slot 585 and the recesses 301 in the readout plane 102 accept the upper ends (i.e., second end) of the plurality of all the qubit chips 101 which have been put in the correct locations by the alignment combs 520A, 520B such that the readout plane 102 drops over all of them (qubit chips 101) simultaneously. The bell-mouthed nature of the recesses 301 in the readout plane 102 assists in the final locating of the ends of the qubit dies 101 into the recesses 301. The readout plane 102 extends through the readout plane housing slot 585 to connect to the circuit board 330, and the circuit board 330 connects to a plurality of connectors 304.

The housing 550 includes a pushing mechanism configured to apply pressure to the readout plane 102, and the pressure applied to the readout plane 102 forces the plurality of qubit chips 101 to the quantum bus plane 100. The pushing mechanism comprises: a pusher block 570 positioned on top of the readout plane 102, and a spring mechanism 575 pressing downward against the pusher block 570. The top part (top cap 582) of the housing 550 applying a compression force to the spring mechanism 575 from above.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of configuring an assembly for a quantum computing device, the method comprising:
   providing a quantum bus plane having a first set of recesses and a readout plane having a second set of recesses;
   positioning the readout plane opposite the quantum bus plane in a block, such that the first set of recesses opposes the second set of recesses; and
   installing a plurality of qubit chips in the block, each of the plurality of qubit chips having a first end positioned in the first set of recesses and having a second end positioned in the second set of recesses.

2. The method of claim 1, wherein the plurality of qubit chips extend vertically in a lengthwise direction by being positioned in both the first set of recesses and the second set of recesses.

3. The method of claim 1, wherein the first set of recesses holds the first end of the plurality of qubit chips in the readout plane; and
   wherein the second set of recesses holds the second end of the plurality of qubit chips in the quantum bus plane; and
   wherein the first end of the plurality of qubit chips is opposite the second end.

4. The method of claim 1, wherein the quantum bus plane comprises a substrate with interconnect wiring on top of the substrate, the interconnect wiring connecting the plurality of qubit chips via a plurality of coupling bus resonators.

5. The method of claim 1, wherein the readout plane comprises a substrate with fan-out wiring on top of the substrate, the fan-out wiring individually connecting each of the plurality of qubit chips to a circuit board; and wherein the circuit board individually connects each of the plurality of qubit chips to a plurality of connectors in a one-to-one relationship.

6. The method of claim 1, wherein the block is configured to receive a first assembly comb and a second assembly comb to form an intersection, the intersection of the first and second assembly combs forming a plurality of slots for individually accepting the plurality of qubit chips; and wherein the plurality of slots mechanically hold the plurality of qubit chips in a vertical position.

7. A method of configuring an assembly for a quantum computing device, the method comprising:

providing a housing configured as an enclosure having a bottom part, a top part, and a block, the block connecting the top and bottom parts;

providing a readout plane having a first set of recesses and a quantum bus plane having a second set of recesses;

assembling the readout plane opposite the quantum bus plane in a block, such that the first set of recesses opposes the second set of recesses; and installing a plurality of qubit chips in the block, each of the plurality of qubit chips having a first end positioned in the first set of recesses and having a second end positioned in the second set of recesses.

8. The method of claim 7, wherein the housing includes a readout plane housing slot through which the readout plane extends; and wherein the readout plane extends through the readout plane housing slot to connect to a circuit board, the circuit board connecting to a plurality of connectors.

9. The method of claim 7, wherein the housing includes a pushing mechanism configured to apply pressure to the readout plane, the pressure applied to the readout plane forces the plurality of qubit chips to the quantum bus plane.

10. The method of claim 9, wherein the pushing mechanism comprises:

a pusher block positioned on top of the readout plane, and a spring mechanism pressing downward against the pusher block, the top part of the housing applying a compression force to the spring mechanism from above.

* * * * *